United States Patent
Ensling et al.

(10) Patent No.: US 11,121,410 B2
(45) Date of Patent: Sep. 14, 2021

(54) SECONDARY ENERGY STORAGE ELEMENT HAVING A REFERENCE ELECTRODE

(71) Applicant: VARTA Microbattery GmbH, Ellwangen Jagst (DE)

(72) Inventors: David Ensling, Ellwangen (DE); Stefanie Scholz, Ellwangen (DE); Stefan Stock, Rainau (DE); Ihor Chumak, Ellwangen (DE)

(73) Assignee: VARTA Microbattery GmbH, Ellwangen Jagst (DE)

( * ) Notice: Subject to any disclaimer, the term of this patent is extended or adjusted under 35 U.S.C. 154(b) by 212 days.

(21) Appl. No.: 16/372,613

(22) Filed: Apr. 2, 2019

(65) Prior Publication Data

US 2019/0312312 A1   Oct. 10, 2019

(30) Foreign Application Priority Data

Apr. 4, 2018  (EP) .................................... 18165727

(51) Int. Cl.
| | |
|---|---|
| *H01M 10/0587* | (2010.01) |
| *G01R 31/382* | (2019.01) |
| *H01M 4/134* | (2010.01) |
| *H01M 10/0525* | (2010.01) |
| *H01M 10/48* | (2006.01) |
| *H01M 50/449* | (2021.01) |
| *H01M 50/463* | (2021.01) |
| *H01M 4/02* | (2006.01) |

(52) U.S. Cl.
CPC ...... *H01M 10/0587* (2013.01); *G01R 31/382* (2019.01); *H01M 4/134* (2013.01); *H01M 10/0525* (2013.01); *H01M 10/48* (2013.01); *H01M 50/449* (2021.01); *H01M 50/463* (2021.01); *H01M 2004/027* (2013.01); *H01M 2004/028* (2013.01); *H01M 2200/00* (2013.01)

(58) Field of Classification Search
CPC ........... H01M 10/0587; H01M 50/449; H01M 50/463; H01M 2200/00; H01M 2004/027; H01M 2004/028; H01M 4/00
See application file for complete search history.

(56) References Cited

U.S. PATENT DOCUMENTS

| | | |
|---|---|---|
| 2013/0323542 A1 | 12/2013 | Wijayawardhana et al. |
| 2015/0214582 A1 | 7/2015 | Skwarek et al. |
| 2017/0324119 A1 | 11/2017 | Powell, Jr. et al. |

FOREIGN PATENT DOCUMENTS

| | | | |
|---|---|---|---|
| DE | 102012213100 | * | 12/2014 |
| DE | 10 2014 001 260 A1 | | 7/2015 |
| DE | 10 2017 109 690 A1 | | 11/2017 |
| WO | 2012/049201 A1 | | 4/2012 |

* cited by examiner

*Primary Examiner* — Ladan Mohaddes
(74) *Attorney, Agent, or Firm* — DLA Piper LLP (US)

(57) ABSTRACT

A secondary energy storage element includes a reference electrode or a constituent thereof positioned between at least one ply of a separator layer and one of electrode layers and electrically insulated from the electrode layer by an insulating means, the reference electrode or the constituent thereof positioned such that there is at least one metal filament or a sheet-shaped metallic coating on a surface of the at least one ply of the separator layer or a surface of the insulating means, within an overlap region the at least one metal filament or the sheet-shaped metallic coating is arranged on the surface of a ply of the separator layer or a surface of the insulating means, and the at least one metal filament or the sheet-shaped metallic coating covers on the surface an area of a maximum of 5% of the area over which the overlap region extends.

15 Claims, 2 Drawing Sheets

SECONDARY ENERGY STORAGE ELEMENT HAVING A REFERENCE ELECTRODE

TECHNICAL FIELD

This disclosure relates to secondary energy storage elements having a reference electrode.

BACKGROUND

Elements suitable for storing electrical energy (for short: energy storage elements) comprise a positive electrode, a negative electrode and a separator separating the positive and negative electrodes from one another. The electrodes and the separator are usually impregnated with an electrolyte. In general, a housing closed in a liquid-tight manner encloses the electrodes, the separator and the electrolyte.

An electrochemical reaction that delivers energy takes place in such energy storage elements, which reaction is composed of two partial reactions that are electrically coupled to one another, but spatially separated from one another. One partial reaction taking place at a comparatively lower redox potential proceeds at the negative electrode, and one at a comparatively higher redox potential proceeds at the positive electrode. During discharge, electrons are liberated at the negative electrode as a result of an oxidation process, resulting in an electron current via an external consumer to the positive electrode, which takes up a corresponding quantity of electrons. A reduction process thus takes place at the positive electrode. At the same time, an ion current corresponding to the electrode reaction occurs within the cell for the purpose of charge balancing. The ion current is ensured by an ion-conducting electrolyte.

In secondary (rechargeable) cells, this discharge reaction is reversible, that is to say that there is the possibility of reversing the conversion of chemical energy into electrical energy that took place during discharge. If the terms "anode" and "cathode" are used in association with secondary cells, the electrodes are generally designated in accordance with their discharge function. The negative electrode in such cells is therefore the anode, and the positive electrode is the cathode.

Widely used examples of secondary energy storage elements are nickel/metal hydride cells and lithium-ion cells.

In secondary energy storage elements, in particular, the electrodes and the separator are often configured as layers. In general, the layers connect to one another to form a layer composite, for example, by adhesive bonding or lamination. Such a layer composite is often present in the form of a winding composite body, in particular a spiral winding. However, it is also possible to process a plurality of such layer composites to form a stack.

To be able to ascertain the existing energy content of a secondary energy storage element, the electrode potential of its electrodes is often determined. The electrode potential indicates what electrical voltage an electrode can supply. The electrode potential of an individual electrode cannot be electrochemically determined since a second electrode is always required for the potential measurement, an electrode potential likewise forming at the second electrode. A reference electrode can be used for this purpose. The electrode potential is then the voltage of the electrode measured relative to the reference electrode.

Lithium-ion-based secondary energy storage elements are known that have a reference electrode in the form of metallic lithium. Alternatively, a lithium titanate reference (so-called LTO reference) can also be used in lithium-ion-based energy storage elements. Such reference electrodes are usually arranged in a housing alongside a stack or winding composed of the layer composite mentioned. However, an electrode potential measured with such positioning of the reference electrode often deviates significantly from the actual potential relationships within a layer composite under dynamic conditions. Only the equilibrium potential can be determined reliably by reference electrodes positioned in this way.

An improved concept for potential determination by a reference electrode is disclosed in WO 2012/049201 A1. An LTO reference constructed in multilayer fashion is integrated into a layer composite composed of electrodes and separators by the cathode being provided with a cutout into which the LTO reference is inserted, or by the reference being inserted between two plies of a multilayered separator. Measurements in the electrode composite are thus also possible. However, the balance between anode and cathode shifts in the region of the layer composite in which the reference is arranged. Furthermore, complex measures have to be taken to insulate the reference within the cutout from direct contact with the cathode. Furthermore, the reference inserted between two plies of a separator can disturb the ion currents between the electrodes.

FIG. 1 of DE 10 2014 001260 A1 discloses a lithium battery, the separator of which comprises a reference electrode. The reference electrode is integrated into a film of the separator or is arranged between the plies of a multilayered separator. The reference electrode can be formed with an appropriately small thickness by a printing method.

DE 10 2017 109690 A1 tackles the question of how artefacts that occur due to the presence of a reference electrode in a lithium battery can be minimized or eliminated. The reference electrode is described as a conductive wire having a resistive coating on the surface thereof. The reference electrode can thus be arranged within a separator between a counterelectrode and an operating electrode.

SUMMARY

We provide a secondary energy storage element including a layer composite having an electrode layer including a positive electrode material and an electrode layer including a negative electrode material and a separator layer arranged therebetween, wherein the separator layer includes at least one ply composed of a microporous material having electrically insulating properties, a reference electrode, an electrolyte with which the layer composite is impregnated and via which the separator layer, the electrode layers and the reference electrode are in contact, and a housing enclosing the layer composite, the reference electrode and the electrolyte, wherein the housing has three poles electrically insulated from one another and able to be tapped from outside the housing, of which the first pole electrically connects to the electrode layer including the positive electrode material, the second pole electrically connects to the electrode layer including the negative electrode material and the third pole electrically connects to the reference electrode, within the layer composite the positive and negative electrode layer enclose between them an overlap region, the reference electrode or a constituent of the reference electrode is positioned between the at least one ply of the separator layer and one of the electrode layers and is electrically insulated from the electrode layer by an insulating means, the reference electrode or the constituent of the reference electrode positioned there is at least one metal filament or a sheet-shaped metallic coating on a surface of the at least one ply of the separator layer or a surface of the insulating means, within the overlap region the at least one metal filament or the sheet-shaped metallic coating is arranged on the surface of a ply of the separator layer or a surface of the insulating means, and the at least one metal filament or the sheet-shaped metallic coating covers on the surface an area of a maximum of 5% of the area over which the overlap region extends.

DETAILED DESCRIPTION

Figure 1:
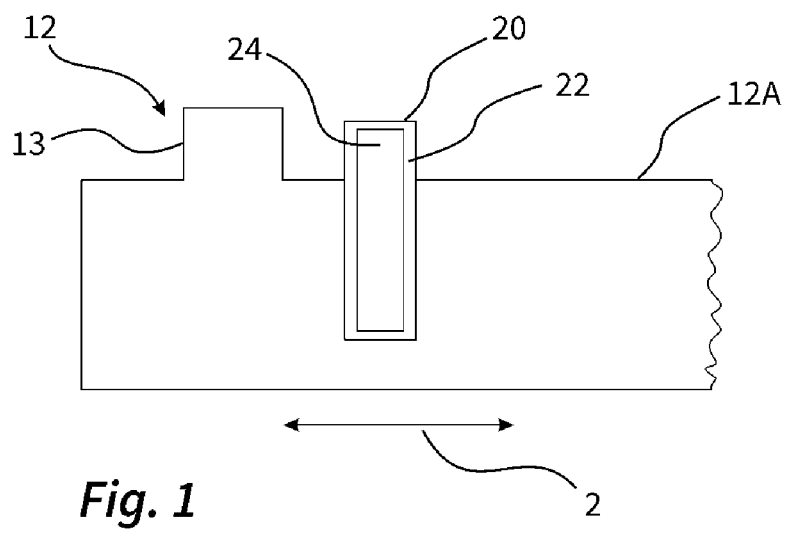
FIG. 1 schematically shows an end piece of a tape-type electrode layer together with, arranged thereon, a strip composed of a film with a metallic coating, which can be processed to form a layer composite of an energy storage element (plan view from above).

Our secondary energy storage elements have the following combination of features:
- a: a layer composite having an electrode layer comprising a positive electrode material (positive electrode layer) and an electrode layer comprising a negative electrode material (negative electrode layer) and a separator layer arranged therebetween,
- b: the separator layer comprises at least one ply composed of a microporous material having electrically insulating properties,
- c: a reference electrode,
- d: an electrolyte with which the layer composite is impregnated and via which the separator layer, the electrode layers and the reference electrode are in contact,
- e: a housing enclosing the layer composite, the reference electrode and the electrolyte, and
- f: the housing has three poles electrically insulated from one another and able to be tapped from outside the housing, of which the first pole electrically connects to the positive electrode layer, the second pole electrically connects to the negative electrode layer and the third pole electrically connects to the reference electrode.

Our secondary energy storage element may comprise the following additional features:
- g: the reference electrode or a constituent of the reference electrode is positioned between the at least one ply of the separator layer and one of the electrode layers and is electrically insulated from the electrode layer by an insulating means, and
- h: the reference electrode or the constituent of the reference electrode positioned there is at least one metal filament or a sheet-type metallic coating on a surface of the at least one ply of the separator layer or a surface of the insulating means.

The reference electrode or a constituent of the reference electrode is thus integrated into the layer composite, although not in the plane of the positive electrode as disclosed in WO 2012/049201 A1, but rather precisely between one of the electrode layers and the separator layer or in the separator layer. The reference electrode therefore also does not influence the electrode balancing. Furthermore, in contrast to WO 2012/049201 A1, within the layer composite there is also arranged only a metal filament or a sheet-type metallic coating and not an LTO reference constructed in multilayer fashion.

Compared to energy storage elements having reference electrodes arranged outside the layer composite, our configuration enables individual electrode potentials to be detected exactly, even under dynamic conditions. Potential relationships can be tapped off within the layer composite. The measurement data obtained can be used, for example, to make statements about the present state of charge, cell ageing and concerning safety aspects such as lithium plating, for example.

The layer composite comprises the layers in the sequence positive electrode layer/separator layer/negative electrode layer. Preferably, one of the electrodes is arranged between two separator layers such that the layer composite has the sequence positive electrode layer/separator layer/negative electrode layer/separator layer or the sequence negative electrode layer/separator layer/positive electrode layer/separator layer.

The electrodes of the energy storage element can be based on very varied materials. Our concepts are applicable to any electrochemical system. However, it is preferred if the energy storage element is a lithium-ion storage element, that is to say an energy storage element having electrodes which intercollate and deintercollate lithium ions during operation.

The electrode layers of the energy storage element usually each comprise a metallic current collector and electrochemically active components (often also referred to as electrode active material) and electrochemically inactive components.

The current collectors serve to make electrical contact with the electrochemically active components over the largest possible area. They usually consist of planar metal substrates, for example, composed of metal films or composed of a metal foam or composed of a metallised nonwoven fabric. The planar metal substrates are generally coated with the electrode active materials on both sides. An electrode layer thus preferably comprises two plies comprising the electrode active materials and a current collector therebetween.

If the energy storage element is a lithium-ion storage element, suitable electrode active materials are all materials that can take up lithium ions and release them again. Known negative electrodes include, for example, carbon-based materials such as graphitic carbon or non-graphitic carbon materials capable of reversibly taking up lithium. Lithium-metal oxide compounds and lithium-metal phosphate compounds such as $LiCoO_2$ and $LiFePo_4$ are suitable, for example, for the positive electrode of secondary lithium-ion systems.

As electrochemically inactive components, mention should primarily be made of electrode binders and conductive media. Electrode binders ensure the mechanical stability of the electrodes and provide for the contacting of the particles composed of electrochemically active material among one another and to the current collector. Conductive media such as carbon black enable electrical conductivity of the electrodes. Suitable electrode binders and conductive media for the various electrochemical systems in energy storage elements are known.

Suitable separators for the layer composites are in particular porous plastic separators, for example, porous plastic membranes, for example, composed of a polyolefin or composed of a polyether ketone. Non-woven fabrics and woven fabrics composed of these materials can also be used.

Irrespective of whether the layer composite is configured as a winding composite body, in particular as a spiral winding, or is part of a stack, the electrode layers preferably have a thickness of 20 μm to 800 μm. Separators having a thickness of 5 μm to 200 μm are preferably used as the separator layer.

If the energy storage element is a lithium-ion storage element, preference is given to using an organic electrolyte, in particular on the basis of organic carbonates. Aqueous, alkaline electrolytes are used in NiMH systems.

In a first particularly preferred example A, the secondary energy storage element is distinguished by at least one, preferably by all, of the following additional features:
  a: the separator layer is configured in multilayer fashion and comprises a first ply composed of the microporous material having the electrically insulating properties and a second ply composed of the microporous material having the electrically insulating properties,
  b: the insulating means is the second ply,
  c: the reference electrode or the constituent of the reference electrode is arranged between the first and second plies.

The insulating means is therefore a ply of the separator layer. The latter accordingly preferably comprises at least two plies composed of the microporous material. In example A, the reference electrode or the constituent of the reference electrode is thus arranged within the separator layer.

Generally, it is preferred if the at least one ply composed of the microporous material of the separator layer, preferably the first and second plies composed of the microporous material, is/are each porous plastic membranes or non-woven fabrics or woven fabrics composed of plastic fibers. Such materials for separators of energy storage elements are known and can be procured commercially. By way of example, microporous polyolefin films are suitable.

Preferably, the first and second plies consist of an identical material. The plies can connect to one another, for example, by adhesive bonding or lamination.

It is possible for one or more further plies (intermediate plies) to be arranged between the first and second plies of the separator layer. The further plies can consist of a different material from that of the first and second plies, for example, a plastic having a lower melting point to be able to bring about a shutdown of the pores of the separator layer in an unplanned heating by melting. In this example, the reference electrode is arranged either between the first ply and an intermediate ply or between the second ply and an intermediate ply or between two intermediate plies.

An arrangement of this type makes possible not only the exact detection of individual electrode potentials. By way of example, the detection of dendrites penetrating into the separator layer is also made possible. Detecting such dendrites involves monitoring, for example, the potential difference between the positive and negative electrode layers and the potential difference between the negative electrode layer and a reference electrode arranged within the separator layer. If the voltage between the negative electrode layer and the reference electrode falls to zero, this is usually attributable to a short circuit between the reference electrode and the negative electrode on account of dendrites penetrating into the separator layer. The energy storage element monitored in this way can then be switched off before a short circuit occurs between the electrode layers.

In a second particularly preferred example B, the secondary energy storage element is distinguished by at least one, preferably by all, of the following additional features:
  a: the separator layer is configured in monolayer or multilayer fashion,
  b: the insulating means is a coating on an outer side of the separator layer or an outer side of one of the electrode layers, wherein the reference electrode or the constituent of the reference electrode is arranged between the outer side of the separator layer and the coating.

In example B, the secondary energy storage element thus has a reference electrode not integrated into a multi-layered separator layer. Instead, the reference electrode or the constituent of the reference electrode is positioned in direct contact with one of the outer sides of the separator layer. In this example, an insulation with respect to the adjoining electrode layer is necessary, which is ensured by the coating. The coating can be applied both directly on the adjoining electrode layer and on the separator layer. In the latter configuration, preferably, the reference electrode or the constituent of the reference electrode is first applied on the outer side of the separator layer and then covered with the coating.

Notwithstanding this, the separator layer in this example, too, can have a multi-layered construction. It is then preferably configured as defined in the description of example A.

Preferably, the at least one metal filament or the sheet-type metallic coating covers the entire contact region between the separator layer and the electrode layer between which the reference electrode or the constituent of the reference electrode is situated. Alternatively, however, the coating can also be restricted to a local contact region around a local reference electrode.

The coating is preferably formed from a microporous material having electrically insulating properties, for example, composed of ceramic particles or plastic particles.

In a third particularly preferred example C, the secondary energy storage element is distinguished by at least one, preferably by all, of the following additional features:
  a: the separator layer is configured in monolayer or multilayer fashion,
  b: the insulating means is a film arranged between the reference electrode or the constituent of the reference electrode and the electrode layer.

In the third preferred example, too, the energy storage element has a reference electrode not integrated in the separator layer. Rather, the reference electrode or the constituent of the reference electrode is preferably in direct contact with one of the outer sides of the separator layer and insulated from the electrode layer adjoining the outer side by the film. Preferably, the reference electrode or the constituent of the reference electrode is applied as a coating on the film, in particular a flat side of the film facing away from the adjoining electrode layer. In the latter configuration, preferably, the reference electrode or the constituent of the reference electrode is first applied on the outer side of the separator layer and then covered with the coating.

In this example, too, the separator layer can have a multi-layered construction. It is then preferably configured as defined in the description of the example A.

This example is of interest particularly if the reference electrode or the constituent of the reference electrode is the filament or is present only as a thin sheet such that the insulating means need only have the form of a thin strip to be able to cover the reference electrode or the constituent of the reference electrode. Particularly preferably, the film is configured in strip-type fashion.

The film preferably consists of an electrically insulating plastic material, in particular a microporous plastic material having electrically insulating properties. This can in particular also be the same material of which the at least one ply composed of the microporous material of the separator layer consists, that is to say, for example, a microporous polyolefin film.

In a fourth particularly preferred example D, the secondary energy storage element is distinguished by at least one, preferably by all, of the following additional features:
  a: the separator layer is configured in monolayer or multilayer fashion,
  b: the insulating means is a microporous coating having electrically insulating properties on an outer side of the reference electrode or on an outer side of the constituent of the reference electrode.

In example D, too, the secondary energy storage element comprises a reference electrode not integrated into the separator. The reference electrode can comprise a thin metal filament, for example, having an electrically insulating, but ion-transmissive coating. The insulating means is then, for example, a thin electrically insulating and microporous plastic coat on the surface of the metal filament. A film is then not required as an insulating means.

In this example, too, the separator layer can have a multilayered construction. It is then preferably configured as defined in the description of the example A.

Among possible developments of the energy storage element that can concern all four of the preferred examples A-D described, there are two particularly preferred examples.

In the first of these two examples, the energy storage element has the following additional feature:
a: the metal filament or the sheet-type metallic coating consists of a metal able to be alloyed with lithium, or a metal alloy able to be alloyed with lithium that reversibly takes up lithium ions and releases them again during operation of the energy storage element under customary operating conditions (operating temperature of up to 80° C.).

In this example, the metal filament or the sheet-type metallic coating itself is the reference electrode and not only a part thereof. The storage element in this example is preferably a lithium-ion storage element.

The metal that takes up lithium ions and releases them again during operation is particularly preferably a metal from the group comprising gold, silver, aluminium, antimony, tin and silicon. All these metals and furthermore also titanium, nickel and high-grade steels, in particular highly noble high-grade steels, can also be used in prelithiated form. They then preferably have as early as prior to the first start-up a proportion of lithium of >1% by weight, preferably >2.5% by weight, in particular >5% percent by weight, particularly preferably >10% by weight. Even copper, which takes up practically no lithium during operation under customary operating conditions, can be used in prelithiated form. It then preferably has a proportion of lithium of >10% by weight.

In the second of the two examples, the energy storage element has the following additional features:
a: the reference electrode comprises as first constituent an electrode on the basis of a compound that can reversibly take up lithium ions and release them again,
b: as a second constituent, the reference electrode comprises the at least one metal filament or the sheet-type metallic coating,
c: the metal filament or the sheet-type metallic coating consists of a metal or a metal alloy that neither alloys with lithium nor reversibly takes up and releases lithium ions during operation of the storage element under customary operating conditions (operating temperature of up to 80° C.),
d: exclusively the second constituent of the reference electrode is positioned between the at least one ply of the microporous material and one of the electrode layers,
e: the first constituent and the second constituent of the reference electrode electrically connect to one another.

The metal filament or the sheet-type metallic coating is therefore not itself the reference electrode, but rather only a part thereof. It functions only as a probe electrically connected to the actual reference, the first constituent of the reference electrode. Thus, the probe is then integrated into the layer composite, but not the reference. The storage element in this example, too, is preferably a lithium-ion storage element.

Particularly preferably, the first constituent of the reference electrode is arranged within the housing, but outside the layer composite. It is preferably in contact with the electrode layers and the separator layer via the electrolyte.

The second constituent of the reference electrode, the probe, preferably consists of a metal that does not take up lithium ions and release them again during operation of the energy storage element under customary operating conditions (operating temperature of up to 80° C.). Particularly preferably, a metal from the group comprising titanium, nickel, high-grade steel, in particular highly noble high-grade steel, and copper is involved.

Preferably, the first constituent of the reference electrode comprises a lithium-metal oxide compound or a lithium-ion phosphate compound or lithium-nickel-manganese-cobalt oxide compound or a lithium titanate compound or a lithium-nickel-cobalt-aluminium oxide compound.

It is particularly preferred for the secondary energy storage element to have one of the following additional features:
  a: the reference electrode positioned between the separator layer and the one of the electrode layers, or the constituent of the reference electrode positioned there, in particular the probe, is present in the form of a coating formed by physical or chemical vapor deposition,
  b: the reference electrode positioned between the separator layer and the one of the electrode layers, or the constituent of the reference electrode positioned there, in particular the probe, is present in the form of a coating formed by a printing method,
  c: the reference electrode positioned between the separator layer and the one of the electrode layers, or the constituent of the reference electrode positioned there, in particular the probe, is present in the form of a metal film which was fixed adhesively.

Formation of the reference electrode or of the probe by vapor deposition or printing can be carried out, for example, on a surface of the separator layer or one of the separator plies or on the insulating means, for example, on the film in accordance with example C above, or on the insulating coating in accordance with example D above. Adhesive fixing of the metal film can be carried out by laminating or adhesively bonding a metal film onto a surface of the separator layer or one of the separator plies or on the insulating means, for example, on the film in accordance with example C above.

It is particularly preferred for the secondary energy storage element to have at least one of the following additional features:
- a: the sheet-type metallic coating is or comprises a sheet having a width of 0.1 mm to 5 mm,
- b: the sheet-type metallic coating comprises at least one sheet having the thickness of 5 nm to 500 nm,
- c: the diameter of the at least one filament is 10 μm to 100 μm,
- d: the at least one metal filament or the sheets of the sheet-type metallic coating form(s) a conductor structure.

The sheet-type metallic coating is or comprises preferably a sheet having a substantially uniform width, in particular within the stated numerical range. Particularly preferably, the sheet has both a width and a thickness within the stated numerical ranges.

The filament is preferably present with a constant diameter over its entire length. It can be present in a net-or lattice-like arrangement.

It is preferred for the secondary energy storage element to have at least one of the three directly following additional features, particularly preferably all three features:
- a: within the layer composite, the positive electrode layer and the negative electrode layer enclose an overlap region between them,
- b: within the overlap region the at least one metal filament or the sheet-type metallic coating is arranged on the surface of a ply of the separator layer or a surface of the insulating means,
- c: the at least one metal filament or the sheet-type metallic coating covers on the surface an area of a maximum of 5% of the area, particularly preferably of a maximum of 1%, of the area over which the overlap region extends.

The overlap region can be defined as the region in which a straight line perpendicular to the electrode layers intersects both electrode layers. The small area coverage of the metal filament or the coating ensures that the functionality of the layer composite is not impaired by the presence of the filament or the coating.

It is particularly preferred for the secondary energy storage element to have one of the following additional features:
- a: the housing is a metallic housing having two pole bushings,
- b: the housing is a metallic or non-metallic housing having three pole bushings.

To ensure the electron current via an external consumer, the housing of the secondary energy storage element must comprise at least two electrical connection locations, a positive pole and a negative pole. A further electrical connection location must be provided for the reference electrode.

Preferably, the housing is configured such that one of the connection locations is the electrically conductive, preferably metallic, housing itself. Consequently, by way of example, the negative pole, or alternatively any other electrical connection location, can be the housing. In this example, only two pole bushings are required.

Preferably, the housing itself is not conductive. In this example, it requires three pole bushings.

The secondary energy storage element can be present in many customary designs, for example, as a cylindrical cell, button cell, prismatic cell, pouch cell and the like. The housing is then configured accordingly.

It is particularly preferred for the secondary energy storage element to comprise an electronic circuit to monitor its voltage, which electrically connects to the electrode layers and the reference electrode via electrical conductors. The electronic circuit is preferably configured such that it can monitor the individual electrode potential of the secondary energy storage element. Preferably, the electronic circuit can monitor the voltage between the electrodes and the reference electrode and, in a short circuit, can electrically isolate the secondary energy storage element from an assemblage of a plurality of energy storage elements and/or display an error message or forward it to a further electronic unit.

Particularly preferably, the secondary energy storage element has the following features:
- a: the electrode layers and the separator layer are present in the form of tapes and are joined together to form a tape-type layer composite,
- b: the tape-type layer composite is present as a winding and comprises the electrode layers and the separator layer in an arrangement wound spirally around a winding axis,
- c: the winding has two end sides formed by longitudinal edges of the electrode layers and the separator layer,
- d: the insulating means is a strip composed of a film composed of the microporous material having electrically insulating properties, which strip has a first flat side and a second flat side,
- e: the reference electrode or the constituent of the reference electrode is a sheet-type metallic coating on the first flat side of the film strip,
- f: the film strip is integrated together with the sheet-type metallic coating into the layer composite and is aligned parallel to the winding axis such that one end of the film strip projects from the winding at one of the end sides,
- g: within the layer composite the first flat side of the film strip is in contact with the separator layer and the second flat side is in contact with one of the electrode layers.

The sheet-type metallic coating preferably connects to an electrical conductor at that end of the film strip that projects from the end side of the winding. If the coating is the reference electrode, then the latter can connect to one of the electrode layers and/or the electronic circuit via the electrical conductor. If the coating is the constituent of the reference electrode, in particular the probe mentioned, then the constituent can connect to the actual reference via the electrical conductor.

Particularly preferably, the secondary energy storage element has the following features:
- a: the electrode layers and the separator layer are present in the form of layers and joined together to form a layer composite,
- b: the layer composite is a constituent of a stack of at least two layer composites,
- d: the insulating means is a strip composed of a film composed of the microporous material having electrically insulating properties, which strip has a first flat side and a second flat side,
- e: the reference electrode or the constituent of the reference electrode is a sheet-type metallic coating on the first flat side of the film strip,
- f: the film strip is integrated together with the sheet-type metallic coating into at least one of the layer composites forming the stack, wherein one end of the film strip projects from the stack such that the sheet-type metallic coating is freely accessible, g: within the at least one layer composite the first flat side of the film strip is in contact with the separator layer and the second flat side is in contact with one of the electrode layers.

Further features, details and advantages are evident from the appended claims and the abstract, the wording of both of which is incorporated by reference in the content of this description, the following description of preferred examples and with reference to the drawings.

The electrode layer 12 illustrated in FIG. 1 is configured in tape-type fashion. It comprises an arrester lug 13. The latter is coupled to a current collector (not illustrated in detail) covered by positive electrode active material and electrically contacts the electrode layer 12. The electrode active material is a material that intercalates lithium.

A strip 20 composed of a film composed of a microporous material having electrically insulating properties, the strip serving as insulating means, is arranged on the electrode layer. The film has a first and a second flat side, wherein the first flat side is visible as the top side 22 of the strip 20. A sheet-type metallic coating 24 having a thickness of 100 nm, for example, is applied on the top side 20 by vapor deposition or a printing method. The strip 20 is arranged perpendicular to the main extension direction 2 of the tape-type electrode layer 12, and projects beyond the longitudinal edge 12a of the electrode layer 12 on the side of the arrester lug 13. In a winding produced using the electrode layer 12, its projecting end therefore projects from the winding at an end side. The metallic coating 24 is insulated from the electrode layer 12 by the strip 20.

Figure 2:
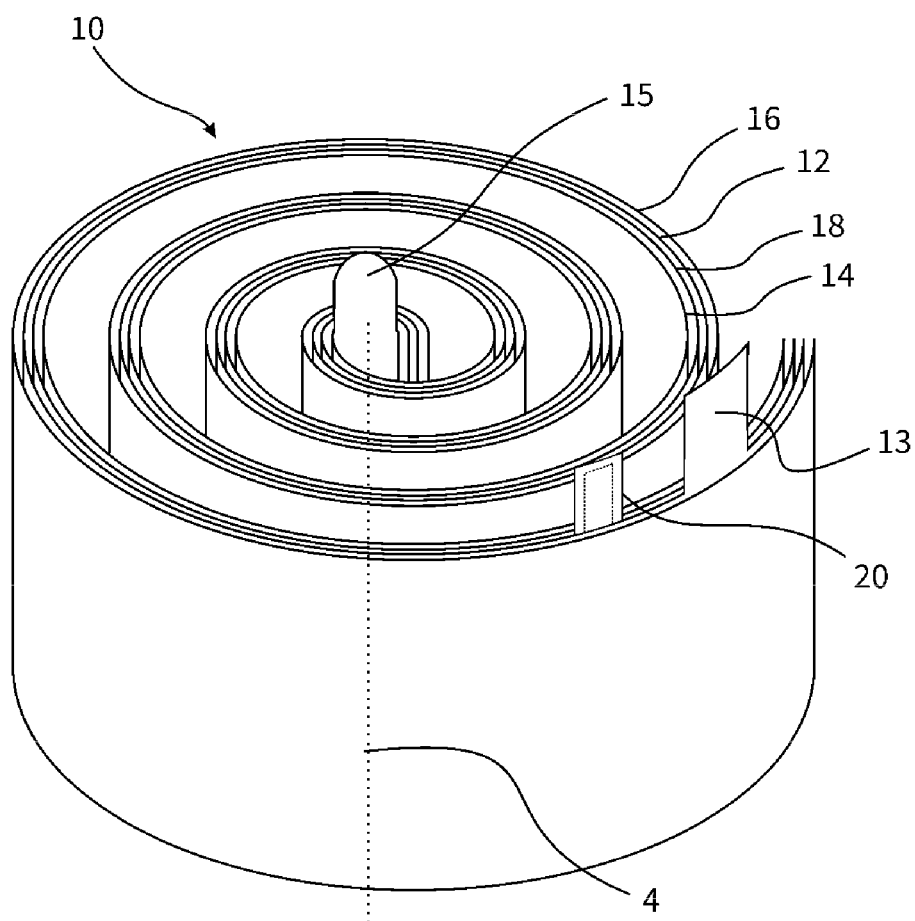
FIG. 2 schematically shows a layer composite in the form of a winding produced using the electrode layer illustrated in FIG. 1 (plan view obliquely from the front).

Such a winding 10 is illustrated in FIG. 2. The winding 10 is more precisely a layer composite in the form of a winding, to form which the tape-type electrode layer 12 illustrated in FIG. 1 is combined with a tape-type electrode layer of opposite polarity 14 and two tape-type separator layers 16, 18 to form a tape-type layer composite and this is wound around a winding axis 4 (dotted line). Like the electrode layer 12, the electrode layer 14 comprises an electrode active material that intercalates lithium.

The separator layers 16 and 18 are preferably configured in monolayer fashion. They each comprise one ply composed of a microporous plastic material. The winding 10 has two end sides formed by longitudinal edges of the electrode layers 12 and 14 and the separator layers 16 and 18. Besides the arrester lug 13 and the projecting end of the strip 20 already mentioned, a second arrester lug 15 projects from the upper, visible end side. The second arrester lug electrically contacts the electrode layer 14.

The coating 24 is positioned within the winding between the electrode layer 12 and the electrode layer 14. It is insulated from the electrode layer 12 by the strip 20 and from the electrode layer 14 by the separator 18, that is to say a ply composed of a microporous plastic material.

Figure 3:
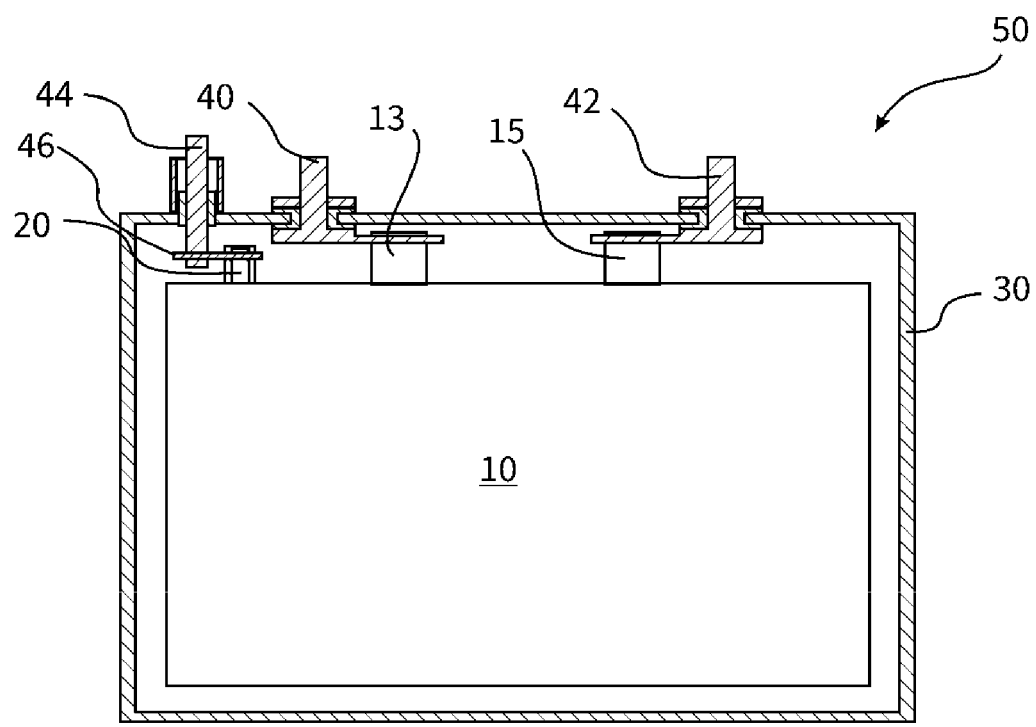
FIG. 3 schematically shows one example of a secondary energy storage element in which a layer composite as illustrated in FIG. 1 is arranged in a housing (sectional illustration).

The energy storage element 50 illustrated in FIG. 3 comprises an example of the winding 10 in which the sheet-type metallic coating consists of prelithiated gold. The coating forms a functional reference electrode 24A.

The winding 10 is enclosed by the housing 30. The latter is filled with an electrolyte, with which the winding 10 is also impregnated. Three poles 40, 42 and 44 are led through the housing. All the poles are electrically insulated from the housing 30. The pole 42 electrically connects to the arrester lug 15. The pole 40 electrically connects to the arrester lug 13. The pole 44 electrically connects to the reference electrode 24A via the connection contact 46 that can be, for example, a terminal.

Figure 4:
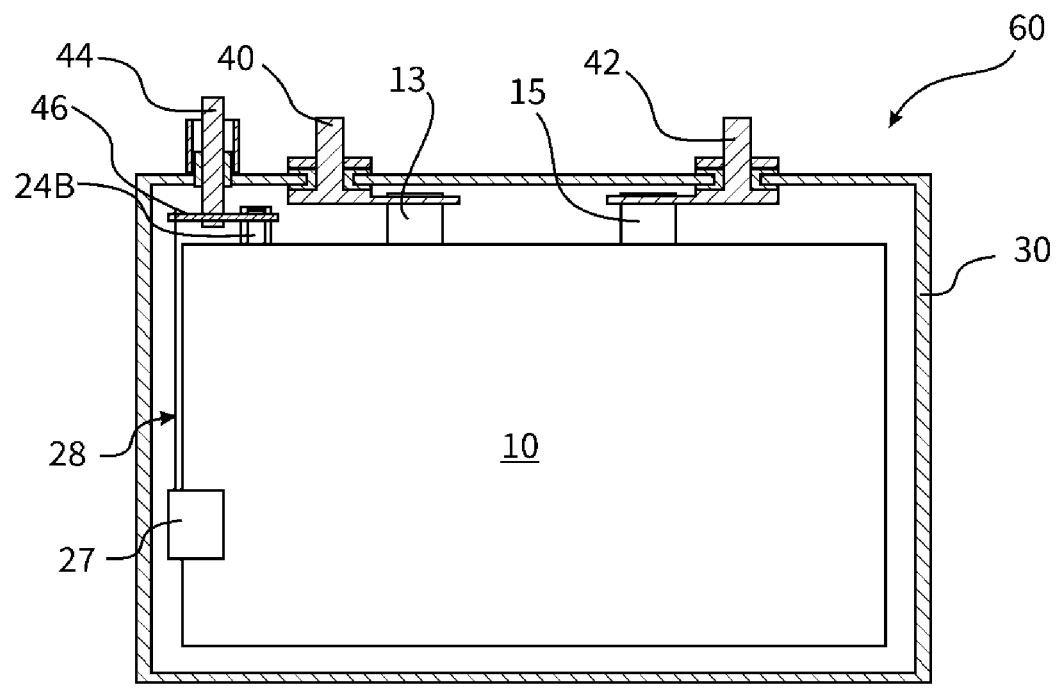
FIG. 4 schematically shows a further example of a secondary energy storage element in which a layer composite as illustrated in FIG. 1 is arranged in a housing (sectional illustration).

The energy storage element 60 illustrated in FIG. 4 comprises an example of the winding 10 in which the sheet-type metallic coating consists of a metal that does not intercalate lithium ions. The coating functions only as a probe 24B. In this example, the reference electrode is constructed in bipartite fashion and comprises the LTO reference 27 besides the probe 24B. The LTO reference electrically connects to the probe 24B via the connection contact 46 and the electrical conductor 28.

Otherwise there are no differences with respect to the example 50.

What is claimed is:

1. A secondary energy storage element comprising:
   a layer composite having an electrode layer comprising a positive electrode material and an electrode layer comprising a negative electrode material and a separator layer arranged therebetween, wherein the separator layer comprises at least one ply composed of a microporous material having electrically insulating properties,
   a reference electrode,
   an electrolyte with which the layer composite is impregnated and via which the separator layer, the electrode layers and the reference electrode are in contact, and
   a housing enclosing the layer composite, the reference electrode and the electrolyte, wherein
   the housing has three poles electrically insulated from one another and able to be tapped from outside the housing, of which the first pole electrically connects to the electrode layer comprising the positive electrode material, the second pole electrically connects to the electrode layer comprising the negative electrode material and the third pole electrically connects to the reference electrode,
   within the layer composite the positive and negative electrode layer enclose between them an overlap region,
   the reference electrode or a constituent of the reference electrode is positioned between the at least one ply of the separator layer and one of the electrode layers and is electrically insulated from said electrode layer by an insulating means,
   the reference electrode or the constituent of the reference electrode positioned there is at least one metal filament or a sheet-shaped metallic coating on a surface of the at least one ply of the separator layer or a surface of the insulating means,
   within the overlap region the at least one metal filament or the sheet-shaped metallic coating is arranged on the surface of a ply of the separator layer or a surface of the insulating means, and
   the at least one metal filament or the sheet-shaped metallic coating covers on said surface an area of a maximum of 5% of the area over which the overlap region extends.

2. The energy storage element according to claim 1, wherein
   the separator layer is multilayered and comprises a first ply composed of the microporous material having the electrically insulating properties and a second ply composed of the microporous material having the electrically insulating properties,
   the insulating means is the second ply, and
   the reference electrode or the constituent of the reference electrode is arranged between the first and second plies.

3. The energy storage element according to claim 1, wherein
the separator layer is a monolayer or multilayered,
the insulating means is a coating on an outer side of the separator layer or an outer side of one of the electrode layers, and
the reference electrode or the constituent of the reference electrode is arranged between the outer side of the separator layer and the coating.

4. The energy storage element according to claim 1, wherein
the separator layer is a monolayer or multilayered, and
the insulating means is a film arranged between the reference electrode or the constituent of the reference electrode and the electrode layer.

5. The energy storage element according to claim 1, wherein
the separator layer is a monolayer or multilayered, and
the insulating means is a microporous coating having electrically insulating properties on an outer side of the reference electrode or on an outer side of the constituent of the reference electrode.

6. The energy storage element according to claim 1, wherein the metal filament or the sheet-shaped metallic coating consists of a metal capable of being alloyed with lithium, or a metal alloy capable of being alloyed with lithium that reversibly takes up lithium ions and releases them again during operation of the energy storage element under customary operating conditions defined as operating temperature of up to 80° C.

7. The energy storage element according to claim 1, wherein
the reference electrode comprises as first constituent an electrode on the basis of a compound that can reversibly take up lithium ions and release them again,
as second constituent, the reference electrode comprises the at least one metal filament or the sheet-shaped metallic coating,
the metal filament or the sheet-shaped metallic coating consists of a metal or a metal alloy that neither alloys with lithium nor reversibly takes up and releases lithium ions during operation of the energy storage element under customary operating conditions defined as operating temperature of up to 80° C.,
exclusively the second constituent of the reference electrode is positioned between the at least one ply of the separator layer and one of the electrode layers, and
the first constituent and the second constituent of the reference electrode electrically connect to one another.

8. The energy storage element according to claim 1, wherein one of
the reference electrode positioned between the separator layer and said one of the electrode layers, or the constituent of the reference electrode positioned there is present in the form of a coating formed by physical or chemical vapor deposition, or
the reference electrode positioned between the separator layer and said one of the electrode layers, or the constituent of the reference electrode positioned there is present in the form of a coating formed by a printing method.

9. The energy storage element according to claim 1, wherein at least one of
the sheet-shaped metallic coating is or comprises a sheet having a width of 0.1 mm to 5 mm,
the sheet-shaped metallic coating is or comprises a sheet having a thickness of 5 nm to 500 nm,
the diameter of the at least one filament is 10 µm to 100 µm, and
the at least one metal filament or the sheets of the sheet-shaped metallic coating form(s) a conductor structure.

10. The energy storage element according to claim 1, wherein
within the layer composite, the positive electrode layer and the negative electrode layer enclose an overlap region between them,
within said overlap region the at least one metal filament or the sheet-shaped metallic coating is arranged on the surface of a ply of the separator layer or a surface of the insulating means, and
the at least one metal filament or the sheet-shaped metallic coating covers on said surface an area of a maximum of 1% of the area over which the overlap region extends.

11. The energy storage element according to claim 1, wherein one of
the housing is a metallic housing having two pole bushings, or
the housing is a metallic or non-metallic housing having three pole bushings.

12. The energy storage element according to claim 1, wherein the energy storage element comprises an electronic circuit to monitor its voltage and electrically connects to the electrode layers and the reference electrode.

13. The energy storage element according to claim 1, wherein
the electrode layers and the separator layer are present in the form of tapes and joined together to form a tape-shaped layer composite,
the tape-shaped layer composite is present as a winding and comprises the electrode layers and the separator layer in an arrangement wound spirally around a winding axis,
the winding has two end sides formed by longitudinal edges of the electrode layers and the separator layer,
the insulating means is a strip composed of a film composed of a microporous material having electrically insulating properties, which strip has a first flat side and a second flat side,
the reference electrode or the constituent of the reference electrode is a sheet-shaped metallic coating on the first flat side of the film strip,
the film strip is integrated together with the sheet-shaped metallic coating into the layer composite and is aligned parallel to the winding axis, wherein one end of the film strip projects from the winding at one of the end sides such that the sheet-shaped metallic coating is freely accessible, and
within the layer composite, the first flat side of the film strip is in contact with the separator layer and the second flat side is in contact with one of the electrode layers.

14. The energy storage element according to claim 13, wherein the sheet-shaped metallic coating connects to an electrical conductor at that end of the film strip that projects from the end side of the winding.

15. The energy storage element according to claim 1, wherein
the electrode layers and the separator layer are present in the form of layers and joined together to form a layer composite,
the layer composite is a constituent of a stack of at least two layer composites, the insulating means is a strip composed of a film composed of a microporous material having electrically insulating properties, which strip has a first flat side and a second flat side, the reference electrode or the constituent of the reference electrode is a sheet-shaped metallic coating on the first flat side of the film strip, the film strip is integrated together with the sheet-shaped metallic coating into at least one of the layer composites forming the stack, wherein one end of the film strip projects from the stack such that the sheet-shaped metallic coating is freely accessible, and within the at least one layer composite, the first flat side of the film strip is in contact with the separator layer and the second flat side is in contact with one of the electrode layers.

* * * * *